(12) United States Patent
Huang et al.

(10) Patent No.: US 7,936,629 B2
(45) Date of Patent: May 3, 2011

(54) TABLE-BASED REFERENCE VOLTAGE CHARACTERIZATION SCHEME

(75) Inventors: Henry F. Huang, Apple Valley, MN (US); Andrew J. Carter, Minneapolis, MN (US); Maroun Khoury, Burnsville, MN (US); Yong Lu, Edina, MN (US); Yiran Chen, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 152 days.

(21) Appl. No.: 12/352,722

(22) Filed: Jan. 13, 2009

(65) Prior Publication Data

US 2010/0177552 A1 Jul. 15, 2010

(51) Int. Cl.
*G11C 7/02* (2006.01)

(52) U.S. Cl. .............. 365/210.1; 365/148; 365/230.03

(58) Field of Classification Search .................. 365/148, 365/210.1, 230.03
See application file for complete search history.

(56) References Cited

U.S. PATENT DOCUMENTS

| | | | |
|---|---|---|---|
| 6,034,891 A | 3/2000 | Norman | |
| 7,154,798 B2 | 12/2006 | Lin et al. | |
| 2008/0158967 A1 | 7/2008 | Mokhlesi et al. | |
| 2008/0158983 A1 | 7/2008 | Mokhlesi et al. | |
| 2009/0237984 A1* | 9/2009 | Porter | 365/163 |
| 2010/0095050 A1* | 4/2010 | Chen et al. | 711/103 |
| 2010/0177562 A1* | 7/2010 | Chen et al. | 365/171 |

* cited by examiner

*Primary Examiner* — Hoai V Ho
(74) *Attorney, Agent, or Firm* — Fellers, Snider, et al.

(57) ABSTRACT

Method and apparatus for reading data from a non-volatile memory cell, such as a modified STRAM cell. In some embodiments, at least a first and second memory cell are read for a plurality of resistance values that are used to select and store a voltage reference for each memory cell.

16 Claims, 5 Drawing Sheets

| $V_{REF}$ Voltage Entry | $V_{MIN}$ Switch Counts (Bit 0) | $V_{MAX}$ Switch Counts (Bit 1) |
|---|---|---|
| V0 | | |
| V1 | | |
| V2 | | |
| ......... | | |
| V3 | | |
| V4 | | |
| V5 | | |
| V6 | | |

FIG. 7

| Block Address Entry | Optimum $V_{REF}$ |
|---|---|
| | |
| | |
| | |
| | |

FIG. 8

TABLE-BASED REFERENCE VOLTAGE CHARACTERIZATION SCHEME

BACKGROUND

Data storage devices generally operate to store and retrieve data in a fast and efficient manner. Some storage devices utilize a semiconductor array of solid-state memory cells to store individual bits of data. Such memory cells can be volatile (e.g., DRAM, SRAM) or non-volatile (RRAM, STRAM, flash, etc.).

As will be appreciated, volatile memory cells generally retain data stored in memory only so long as operational power continues to be supplied to the device, while non-volatile memory cells generally retain data storage in memory even in the absence of the application of operational power.

In these and other types of data storage devices, it is often desirable to increase efficiency and accuracy during operation, particularly with regard to the reading of data from the storage array.

SUMMARY

Various embodiments of the present invention are generally directed to a method and apparatus for reading data from a non-volatile memory cell, such as but not limited to a STRAM or RRAM memory cell.

In accordance with various embodiments, at least a first and second memory cell are read for a plurality of resistance values. The read resistance values are used to select a voltage reference for each memory cell. The selected voltage reference is stored for at least the first and second memory cells.

In other embodiments, a memory array having a plurality of memory cells is controlled by a circuit configured to read a plurality of resistance values for at least a first and second memory cell in the memory array. The plurality of resistance values are used to select and store a voltage reference for at least the first and second memory cells.

These and various other features and advantages which characterize the various embodiments of the present invention can be understood in view of the following detailed discussion and the accompanying drawings.

BRIEF DESCRIPTION OF THE DRAWINGS

FIG. 7 displays a voltage reference statistical table operated in accordance with the various embodiments of the present invention.

FIG. 8 displays a look up table operated in accordance with the various embodiments of the present invention.

DETAILED DESCRIPTION

Figure 1:
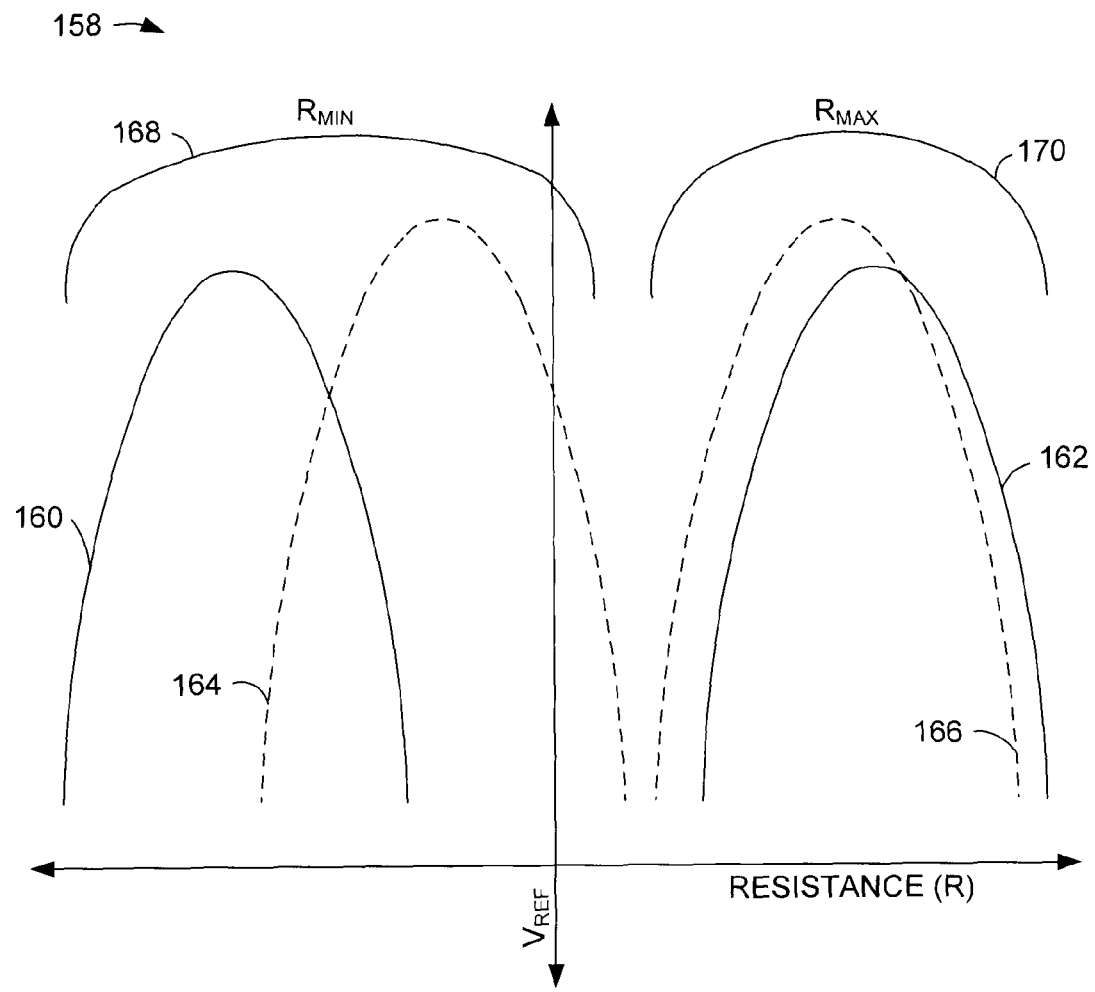
FIG. 1 shows global MTJ variance of resistance values.

FIG. 1 illustrates an exemplary global resistance distribution 158 that consists of a composite of several local resistance distributions. For a particular memory cell, a low resistance distribution 160 and a high resistance distribution 162 will be read. However, other memory cells can have differing resistance distributions as shown by the alternate low resistance distribution 164 and alternate high resistance distribution 166. The low resistance maximum 168 and high resistance minimum 170 for the exemplary memory cells illustrate that the voltage reference as selected may not accurately provide a logic state for the alternate memory cell.

Still referring to FIG. 1, it is generally desirable to select a voltage reference $V_{REF}$ that clearly differentiates between the low and high resistance distribution 160 and 162 so that the logical states of a memory cell can be accurately read. When global variations in the low and high resistance distributions 164 and 166 mandate a different voltage reference to distinguish between the logic states, an accurate memory cell read can occur if a global voltage reference is selected where no resistance value overlaps the voltage reference, such as the alternate low resistance distribution 164. The result of the use of a single global voltage reference will not accurately differentiate between logic states because there is not a clear distinction between high and low resistance distributions. Thus, while a single global voltage reference may be able to correctly differentiate the logic states of those cells at the respective ends of the distributions, the global reference voltage may provide an incorrect indication of the logic state of those cells that fall in the overlapped region.

Figure 2:
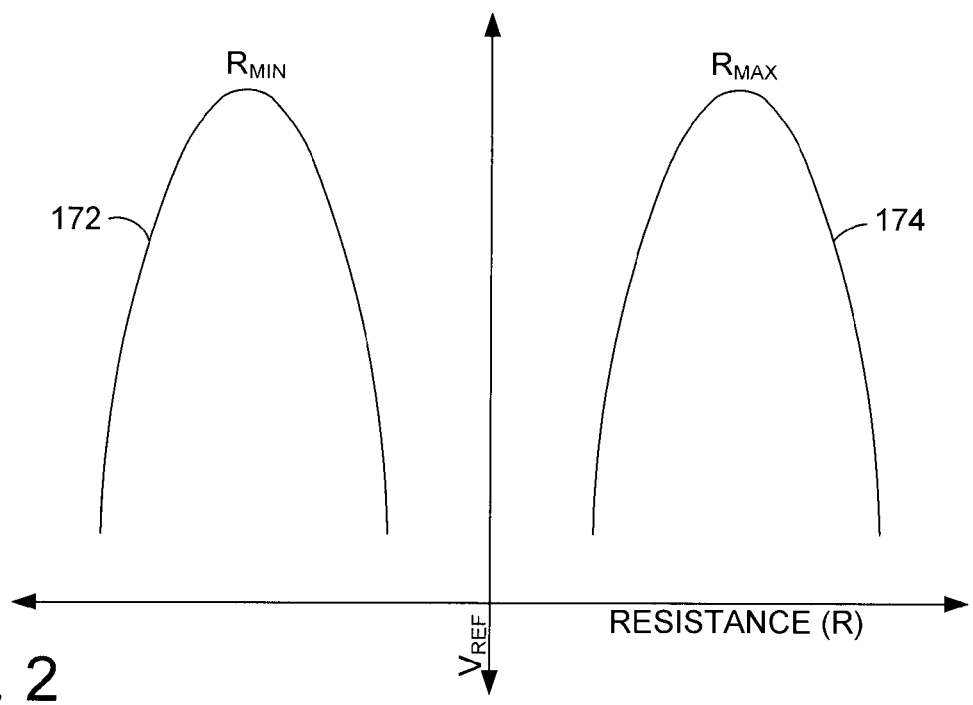
FIG. 2 displays a target MTJ resistance distribution.

A present embodiment illustrated in FIG. 2 selects a voltage reference for each memory cell that allows clear distinction between low resistance distribution 172 and the high resistance distribution 174. In contrast to FIG. 1, the targeted voltage reference allows clear differentiation between the low resistance maximum and the high resistance minimum. Thus, the memory cell illustrated in FIG. 2 will consistently provide accurate logic states upon a read operation.

Figure 3:
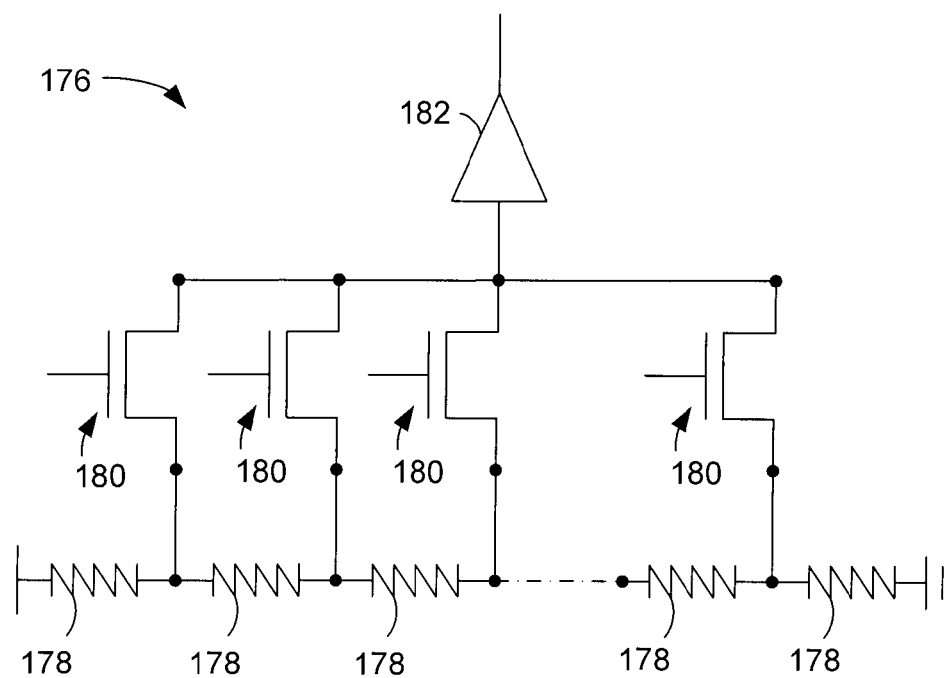
FIG. 3 generally illustrates a voltage reference generator operated in accordance with various embodiments of the present invention.

FIG. 3 shows an embodiment of a voltage reference generator 176. A series of resistors 178 are connected and individually selectable through the activation of transistors 180 to provide a resistive ladder network between a source voltage and a reference (such as ground). A driver 182 is coupled to the transistors 180 to provide amplification of the output of the voltage generator 176. The voltage generator 176 allows for various voltage outputs depending on the selection of a single or number of transistors.

As operated, the various voltage outputs from the voltage generator 176 can be alternatively produced through the use of a digital to analog converter (DAC) to which a digital value is supplied. The various voltage outputs can also be supplied by a different ladder structure than provided in FIG. 3, etc. The utilization of any structure that can reliably output a precise voltage is acceptable in the present embodiment.

Figure 4:
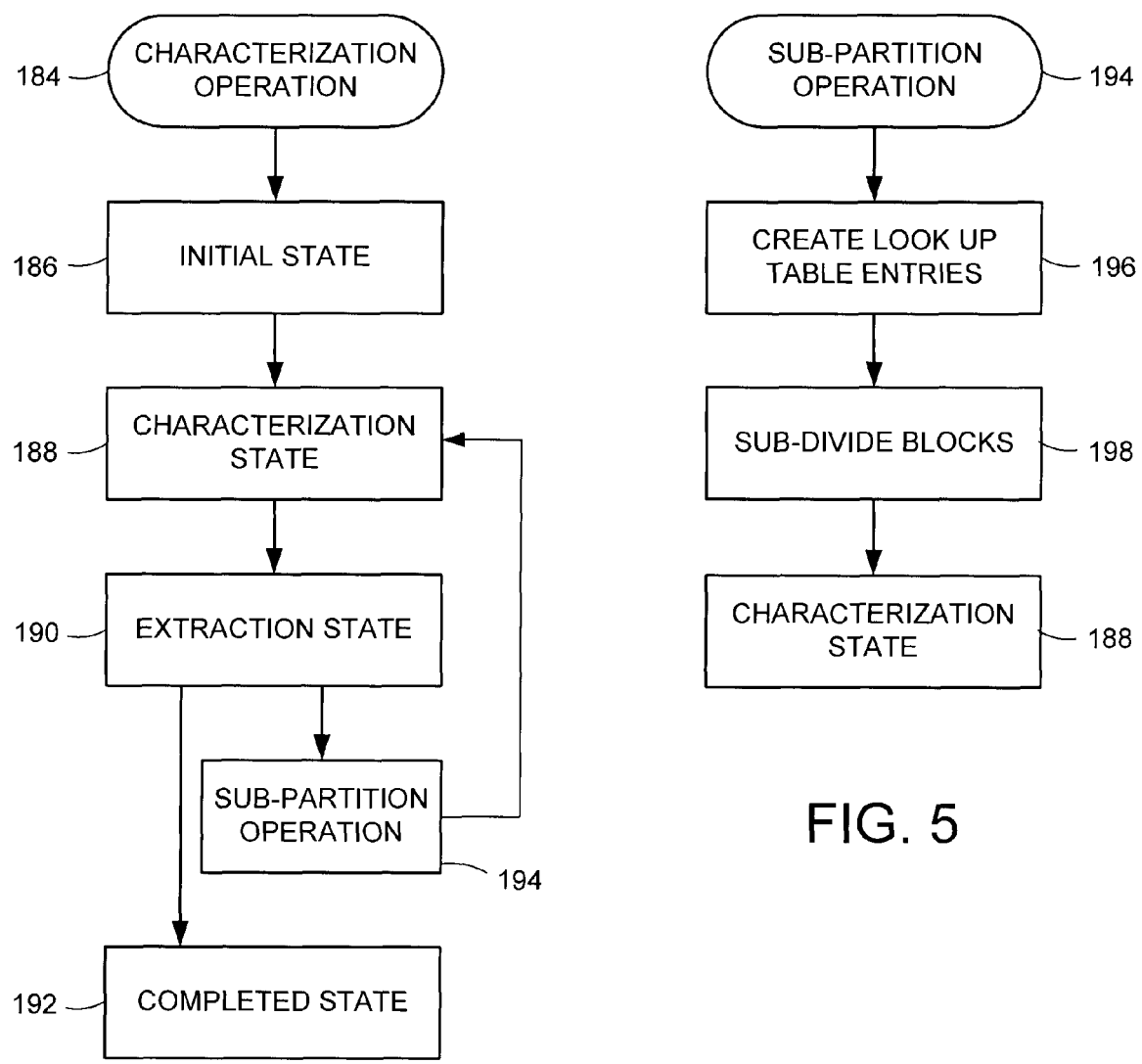
FIG. 4 shows a flow diagram for a characterization operation performed in accordance with the various embodiments of the present invention.

FIG. 4 shows a flow diagram of the characterization operation 184 that functions in one embodiment on initial power up. Upon an array of memory cells first receiving power, an embodiment of the present invention begins to characterize the array for reference values. In an initial state 186, all memory cells are treated as a single block and written to an initial logical state, such as a logic state of 0. The initial state 186 is followed by a characterization state 188 that uses the voltage generator 176 of FIG. 3 to produce several distributions of resistance values.

In one embodiment, a resistance value distribution (172 or 174 of FIG. 2) is produced by repetitively reading each cell in turn using different voltage reference values that successively change in magnitude, and monitoring the output of a sense amplifier. The resistance of the cell can be correlated to the reference voltage at which the output of a sense amplifier changes state.

For example, if the cell is initially written to a logic state of 0, the resistance of the cell will be relatively low ($R_L$), and the voltage drop thereacross will also be relatively low for a given sense current. Use of an initial, relatively high voltage reference value will provide an output of 0 from the sense amplifier. Incrementally decreasing the reference voltage will eventually provide a reference value below the voltage drop across the cell, at which point the output of the sense amplifier will switch to a logical 1.

This reference value can be used as an indication of the actual $R_L$ resistance of the cell; that is, the resistance $R_L$ will be substantially equal to the reference value divided by the sense current. Because of this proportionality, the resistance of the cell can be "read" merely by detecting the corresponding transition reference voltage, irrespective of whether the actual resistance of the cell is specifically calculated therefrom.

Once low resistance reference values have been obtained for all of the memory cells, the cells are written to a logic state of 1 and the foregoing process is repeated (the initial reference values and direction of sweeping may be the same, or may be different as desired). It will be appreciated that the foregoing example is merely illustrative and any number of sensing techniques can be used to determine the respective distributions 172, 174 of FIG. 2.

An extraction state 190 then proceeds to compare a low resistance maximum value obtained from the low resistance distribution to a high resistance minimum value obtained from the high resistance distribution. A differentiation between resistance distributions is indicated by having the high resistance minimum being greater than the low resistance maximum. An embodiment of the present invention moves to a completed state 192 and stores the voltage reference for the block of memory in a table if the high resistance minimum is greater than the low resistance maximum. However if the high resistance minimum is less than the low resistance maximum, there will be an overlap in the distributions, so the use of a single global reference value may not correctly identify the logic state of all cells. In such case, a sub-partition operation 194 is conducted.

Figure 5:
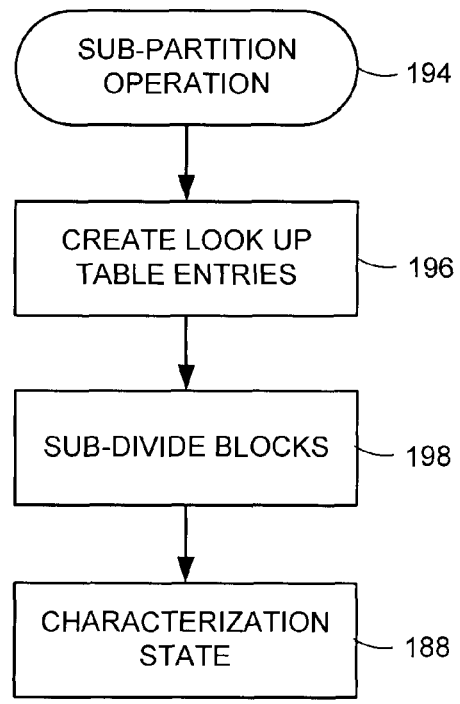
FIG. 5 displays a flow diagram for a sub-partition operation performed in accordance with the various embodiments of the present invention.

FIG. 5 displays the sub-partition operation 194 as included in the characterization operation 184 of FIG. 4. The sub-partition operation 194 creates look up table entries at step 196 to accommodate the sub-division of blocks in step 198. A sub-division of blocks divides the previous memory block into predetermined smaller block sizes. Once the memory blocks are divided, the characterization state 188 is entered and operated.

It should be noted that the sub-partition operation 194 likely occurs in a high percentage of characterization operations 184 due to the fact that a single voltage reference for a plurality of memory cells will often not provide accurate logical state reading. Therefore, the sub-partition operation 194 will cycle and continue to sub-divide the memory blocks until optimal differentiation of resistance distributions are obtained, as illustrated in FIG. 2. Thus, it is recognized that the characterization operation 184 can produce a single voltage reference or a voltage reference for every bit in a memory array as necessary.

Figure 6:
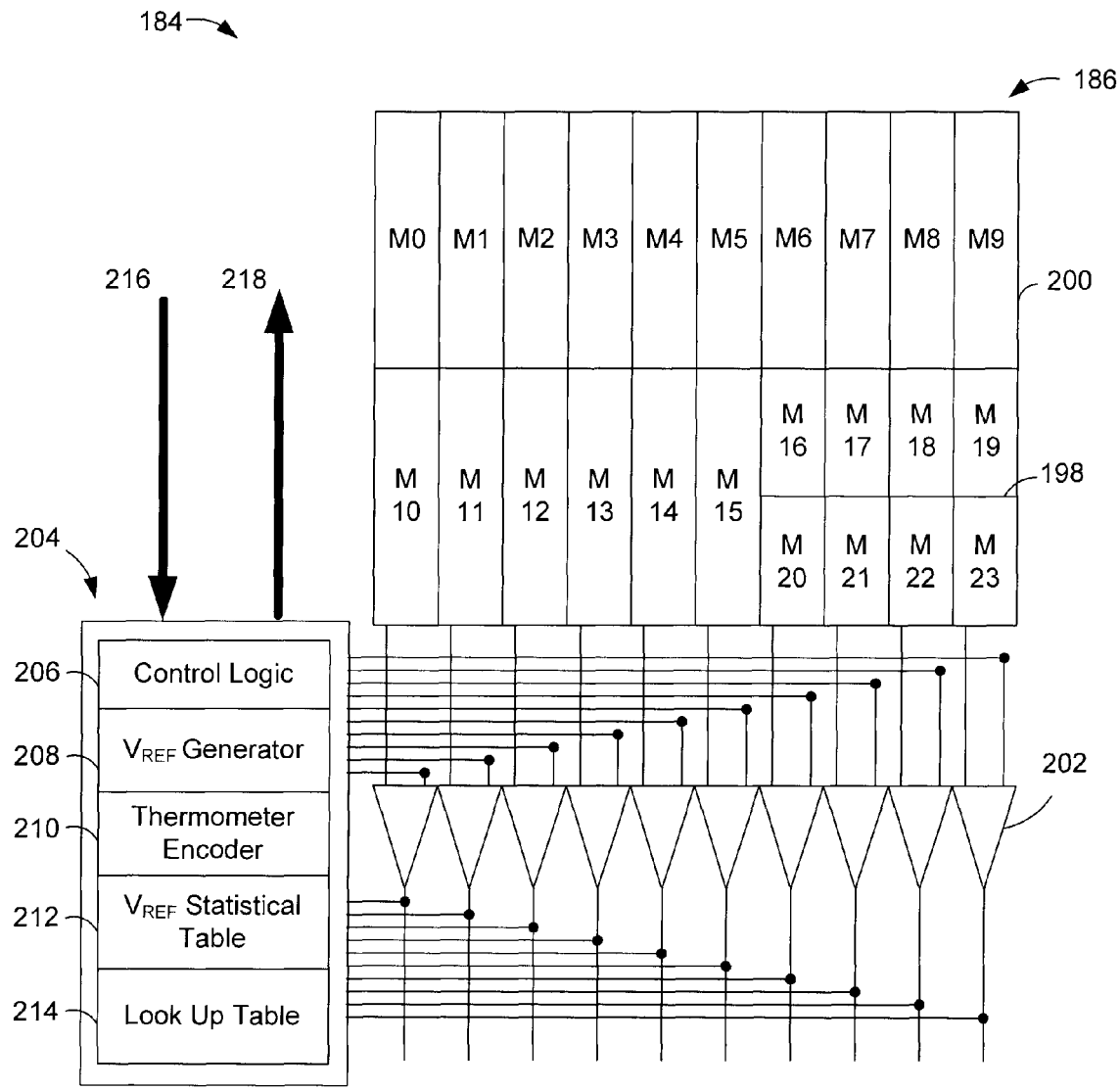
FIG. 6 generally illustrates a table-based characterization system in accordance with various embodiments of the present invention.

A structural embodiment of the table-based characterization scheme is shown in FIG. 6. A table-based characterization system 184 is displayed with various embodiments of the present invention. One such embodiment is the memory array 186 that can be comprised of a variety of types of memory cells such as MRAM, STRAM, and RRAM. In addition, the sizes of the memory cells in the memory array can vary as shown by the partition 198. Further, each memory cell 200 of the memory array 186 is connected to a comparator 202 that allows for determination of a memory cell's logic state.

Functionally, a determination of a memory cell's logic state requires a comparison of a read voltage from the memory cell 200 and a voltage reference. The selection and storage of a voltage reference for each cell is illustrated in FIGS. 4 and 5. The structural embodiment of FIGS. 4 and 5 are represented by the characterization generator 204. A control logic module 206 comprises a state machine that controls the characterization flow discussed in FIGS. 4 and 5. The characterization of a memory cell 200 or memory array 186 undergoes an optimization that requires a series of voltage references to be tested and evaluated. In one embodiment, the series of voltage references are created by a voltage reference generator 208, which can be a ladder structure illustrated in FIG. 3 or the equivalent such as a digital to analog converter. A thermometer encoder 210 is utilized to generate control signals for digital to analog switching used by the voltage reference generator 208.

In order to select an optimized voltage reference, a statistical table 212 is used by the extraction state 190 of FIG. 4 to determine a low resistance maximum and a high resistance minimum. The extraction state 190 of FIG. 4 compares the low resistance maximum to the high resistance minimum to determine if a sub-partition state 192 of FIGS. 4 and 5 is necessary. Once an optimized voltage reference is selected by the extraction state 190 of FIG. 4, one embodiment of the present invention stores the voltage reference in a look up table 214. The table correlates each memory cell to an optimized voltage reference to provide efficient and accurate feedback during read operations.

In operation after the characterization operation, an input address 216 will enter the characterization generator 204 to direct the control logic to read a single memory cell 200 or a number of cells. A read voltage will enter the comparator 202 and be evaluated in relation to a voltage reference obtained from the look up table 214 for a determination of a logic state. The logic state will subsequently leave the characterization generator 204 in an output signal 218 to be used by an external device.

An exemplary voltage reference statistical table (212 of FIG. 6) is set forth at 220 in FIG. 7. In one embodiment, the statistical table 220 records the number of switches between logic states for each memory cell. The number of counts for each transition are used by the extraction state (190 of FIG. 4) to derive a low resistance maximum number and a high resistance minimum number to allow for a determination of an optimal voltage reference for each memory cell.

As an optimized voltage reference is being selected, a look up table 222 is utilized for correlating memory cell addresses with voltage references. One embodiment of a look up table 222 is displayed in FIG. 8. The look up table 222 will continually evolve and expand as the characterization operation and sub-partition operation (184 and 194 of FIGS. 4 and 5) are performed. At the conclusion of characterization operation, the look up table will store an optimal voltage reference for all memory cells. The populating of the look up table 222 at an initial power up stage for the memory cells advantageously allows for efficient and accurate reads for an extended amount of time.

While the optimization of memory cells through the characterization operation consumes time and power, storing the optimized voltage references in a table allows for very quick subsequent memory cell initialization and reads. In contrast if the characterization operation was performed every time the memory cells were deactivated, the time savings from the reduced number of read errors would likely not outweigh the time required to populate the look up table. Thus, a single optimization of memory cells through the population of a look up table with voltage references at the cells initial power up stage provides an efficient use of the embodiments of the present invention As can be appreciated by one skilled in the art, the various embodiments illustrated herein provide advantages in both memory cell efficiency and complexity. The ability to use a uni-directional current to read and write a memory cell allows for fewer components of a memory array, such as the need to provide multiple sets of source and bit lines. Moreover, the self-reference read operation allows for precise measurements and differentiation of resistances and logical states. Such variations in memory cell resistances can be considerable and can result in frequent read errors. Thus, a cell-to-cell measurement of memory cell resistances allows for more accurate and efficient read. However, it will be appreciated that the various embodiments discussed herein have numerous potential applications and are not limited to a certain field of electronic media or type of data storage devices.

Other advantages of the various embodiments presented herein will readily occur to the skilled artisan in view of the present disclosure. For example, outliers in the respective distributions may indicate defective cells which can be deallocated from further use. Moreover, reference values can be assigned to groups of cells in any convenient manner, whether at the array level, individual block level, at the sector level, at the word line level, etc. It will further be appreciated that groups of cells for a given reference value can be physically discontinuous and hence non-adjacent to one another. For example, cells adjacent a particular feature of the physical construction of the array (e.g., closely proximate decoding circuitry, etc.) may be grouped together and share a selected reference value. These and other considerations can be readily implemented depending on the requirements of a given application.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising:
    reading a plurality of resistance values for at least a first and second memory cell;
    determining a voltage reference for each memory cell from the resistance values; and
    storing each voltage reference for at least the first and second memory cells in a table on-chip that characterizes at least two memory blocks of different sizes based on the selected voltage reference.

2. The method of claim 1, wherein at least one memory block undergoes a sub-partition process.

3. The method of claim 1, wherein the voltage reference is selected and stored for each memory cell at an initial power up stage of the memory cells.

4. The method of claim 3, wherein the voltage reference for at least one memory cell is recalled after deactivation and subsequent initiation of the memory cells.

5. The method of claim 1, wherein the voltage reference is selected from a first distribution based on a first resistance and a second distribution based on a second resistance.

6. The method of claim 1, wherein the voltage reference is selected from a distribution that comprises both an increasing and decreasing range of potential voltage references.

7. The method of claim 1, wherein the plurality of memory cells are each characterized as a resistive random access memory (RRAM) cell.

8. The method of claim 1, wherein the plurality of memory cells are each characterized as a spin-torque transfer random access memory (STRAM) cell.

9. An apparatus, comprising:
    a memory array comprising a plurality of memory cells;
    a control circuit configured to read a plurality of resistance values for at least a first and second memory cell in the memory array, select a voltage reference for each memory cell from the resistance values, and store each voltage reference for at least the first and second memory cells in a table on-chip that characterizes at least two memory blocks of different sizes based on the selected voltage reference.

10. The apparatus of claim 9, wherein at least one memory block undergoes a sub-partition process.

11. The apparatus of claim 9, wherein the voltage reference is selected and stored for each memory cell at an initial power up stage of the memory cells.

12. The apparatus of claim 11, wherein the voltage reference for at least one memory cell is recalled after deactivation and subsequent initiation of the memory cells.

13. The apparatus of claim 9, wherein the voltage reference is selected from a first distribution based on a first resistance and a second distribution based on a second resistance.

14. The apparatus of claim 9, wherein the voltage reference is selected from a distribution that comprises both an increasing and decreasing range of potential voltage references.

15. The apparatus of claim 9, wherein the plurality of memory cells are each characterized as a resistive random access memory (RRAM) cell.

16. The apparatus of claim 9, wherein the plurality of memory cells are each characterized as a spin-torque transfer random access memory (STRAM) cell.

* * * * *